United States Patent
Baeskow

(10) Patent No.: US 6,506,328 B1
(45) Date of Patent: Jan. 14, 2003

(54) PROCESS FOR PRODUCING AN ELECTRONIC COMPONENT

(75) Inventor: Werner Baeskow, Hessigheim (DE)

(73) Assignee: Beru G, Ludwigsburg (DE)

( * ) Notice: Subject to any disclaimer, the term of this patent is extended or adjusted under 35 U.S.C. 154(b) by 0 days.

(21) Appl. No.: 09/392,510

(22) Filed: Sep. 10, 1999

(30) Foreign Application Priority Data

Sep. 10, 1998 (DE) .......................................... 198 41 498

(51) Int. Cl.7 ..................... B29C 45/14; B29C 47/02; B29C 70/70; B29C 70/72
(52) U.S. Cl. ............... 264/255; 264/271.1; 264/272.15; 264/272.17; 29/841
(58) Field of Search ...................... 264/272.13, 272.17, 264/272.11, 272.19, 272.15, 255, 271.1, 328.8, 272.14; 29/840, 841, 843

(56) References Cited

U.S. PATENT DOCUMENTS

| 3,313,084 A | | 4/1967 | Forman | |
|---|---|---|---|---|
| 4,370,292 A | * | 1/1983 | Yanase et al. | 264/272.11 |
| 4,398,785 A | * | 8/1983 | Hedrick | 264/272.11 |
| 4,772,929 A | * | 9/1988 | Manchester | 357/27 |
| 5,196,794 A | * | 3/1993 | Murata | 324/251 |
| 5,724,730 A | * | 3/1998 | Tanaka | 29/868 |
| 5,849,230 A | * | 12/1998 | Murohara | 264/138 |
| 5,895,620 A | * | 4/1999 | Pas et al. | 264/272.13 |
| 5,973,424 A | * | 10/1999 | Engelberger et al. | 264/272.2 |
| 6,056,909 A | * | 5/2000 | Wehling et al. | 264/272.15 |
| 6,136,250 A | * | 10/2000 | Brown | 264/272.2 |
| 6,162,381 A | * | 12/2000 | Onishi et al. | 264/272.15 |

FOREIGN PATENT DOCUMENTS

| DE | 93 11 223 U1 | 10/1993 |
|---|---|---|
| DE | 44 30 798 A1 | 3/1996 |
| DE | 195 15 188 | 11/1996 |

* cited by examiner

*Primary Examiner*—Angela Ortiz
(74) *Attorney, Agent, or Firm*—Nixon Peabody LLP; David S. Safran

(57) ABSTRACT

A process for producing an electronic component, such as a Hall sensor, in which electronic parts are located in a plastic housing. The process includes the steps of locating the electronic parts in a hot-melt adhesive, allowing the hot-melt adhesive to solidify, and finish-extrusion coating the electronic parts in the solidified hot-melt adhesive to form the housing. In an alternative embodiment, the process may also include the step of embedding the electronic parts in the hot-melt adhesive. In yet another embodiment, the process may also include the step of extrusion-coating the electronic parts with the hot-melt adhesive. Materials having substantially similar coefficients of thermal expansion may be used for the hot-melt adhesive used for mounting the electronic parts, and for the finish-extrusion coating that forms the housing to minimize effects of thermal expansion. The process is efficient and cost effective.

14 Claims, 3 Drawing Sheets

PROCESS FOR PRODUCING AN ELECTRONIC COMPONENT

BACKGROUND THE INVENTION

1. Field of the Invention

The invention relates to a process for producing an electronic component in which electronic parts are located in a plastic housing, such as a Hall sensor.

2. Description of Related Art

Electronic components have been produced to date by potting or tightly embedding their electronic parts in a plastic housing because direct extrusion coating of electronic parts is not possible due to the thermal stresses in an extrusion coating process. These thermal stresses can result in possible damage of the electronic components due to the pressure load which occurs thereby. This means that finish-extrusion coating, for example, with thermoplastics or duroplastics, can destroy the electronic parts and can damage them because of the overly high pressure and at overly high temperature. On the other hand, potting with PU or epoxy resins is undesirable since such potting becomes hard and inflexible after curing.

To protect electronic parts against the damaging effects of an overly high pressure or an overly high temperature, they must be protected with an additional cover or a cap or by a potting compound in order to keep the injection compound away. This results in the fact that additional parts such as housing, cover, etc. must be used at added material and manufacturing costs.

In addition, potting of electronic parts, for example, with PU potting, requires a high cycle time for setting and is impractical for use in series production.

Other problems in the conventional production processes lie in the lack of fixing of the protective cover or the protective cap, formation of cavities with air inclusions, problems with different coefficients of thermal expansion of the materials during embedding with hard potting compounds and in the danger of cracks of parts during temperature cycles.

These difficulties become apparent in the conventional production processes as high time consumption and costs.

SUMMARY OF THE INVENTION

The primary object of the present invention is to devise an improved process for producing an electronic component in which electronic parts are located in a plastic housing that is efficient and cost effective.

This primary object is achieved the process for producing an electronic component in accordance with the present invention where the electronic parts are located in a hot-melt adhesive mass and afterwards, are finish-extrusion coated to form the housing.

In the process in accordance with the present invention, reliable embedding and fixing of the electronic parts in the hot-melt adhesive mass is possible such that the housing can then be formed with a conventional extrusion coating process and the electronic component thus acquires its final form.

Preferably, the electronic parts are embedded in the hot-melt adhesive mass or are extrusion coated with the hot-melt adhesive mass.

In particular, if similar materials are used for the mount of the electronic parts, the hot-melt adhesive as well as the housing, it is possible to equalize the coefficients of thermal expansion of these materials to such an extent that no problems arise in respect to thermal expansion.

In one preferred embodiment, these materials are polyamide materials.

This and other objects, features and advantages of the present invention will become more apparent from the following detailed description of the preferred embodiments when viewed in conjunction with the attached drawings.

DETAILED DESCRIPTION OF THE PREFERRED EMBODIMENT

The following discussion describes in detail a Hall sensor produced using a process in accordance with the present invention. However, as can be readily appreciated by one skilled in the art, the process for producing an electronic component in accordance with the present invention may be used to produce any electronic component which has electronic parts which are located in a housing. Therefore, the present invented process and the discussion below should not be construed to be limited to the production of Hall sensors only, but may also be used to produce other electronic components as well.

Figure 3A:
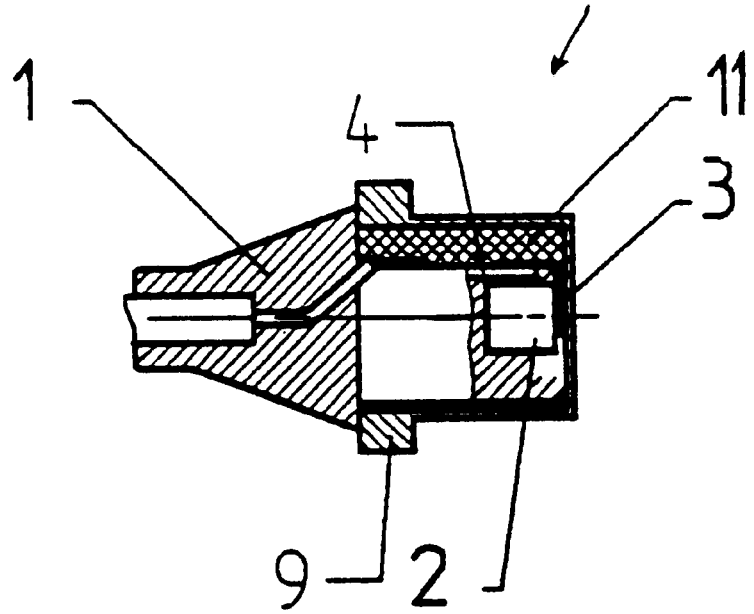
FIGS. 3a and 3b each show a sectional view of a Hall sensor which was produced using a conventional process.
Figure 3B:
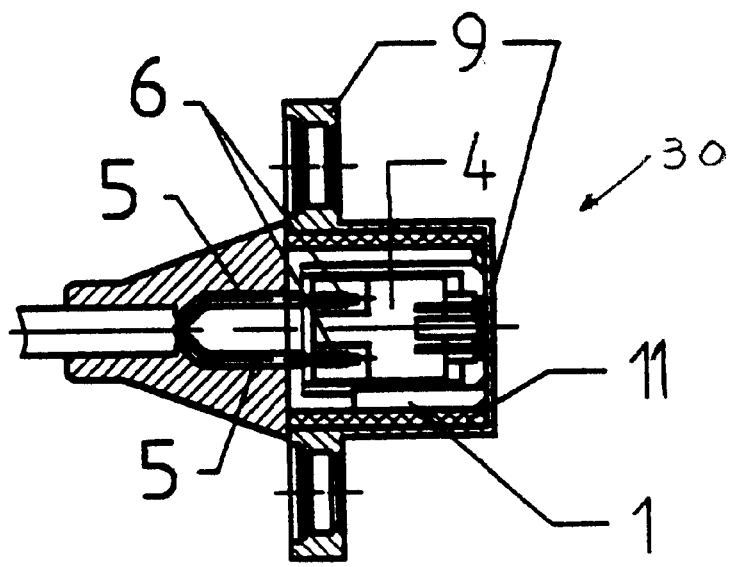

A Hall sensor 30 produced using a prior art, conventional process is shown in FIGS. 3a and 3b. The Hall sensor 30 includes a mount 1, a magnet 2, a Hall IC 3, a board 4, a terminal lead 5 with a solder point 6, a housing 9 and a casting resin 11. The mount 1 with the magnet 2, the Hall IC 3 and the board 4 assembled with electronic components are located in a housing 9 in a conventional production process as a unit, together with the soldered lead 5, and are then potted with the resin 11.

A Hall sensor 10 produced using the process in accordance with the present invention is shown in FIGS. 1a, 1b and 2a, 2b. The elements which are common to the Hall sensor 10 and Hall sensor 30 (prior art) have been enumerated using the same numerals for ease of comparison.

Figure 1A:
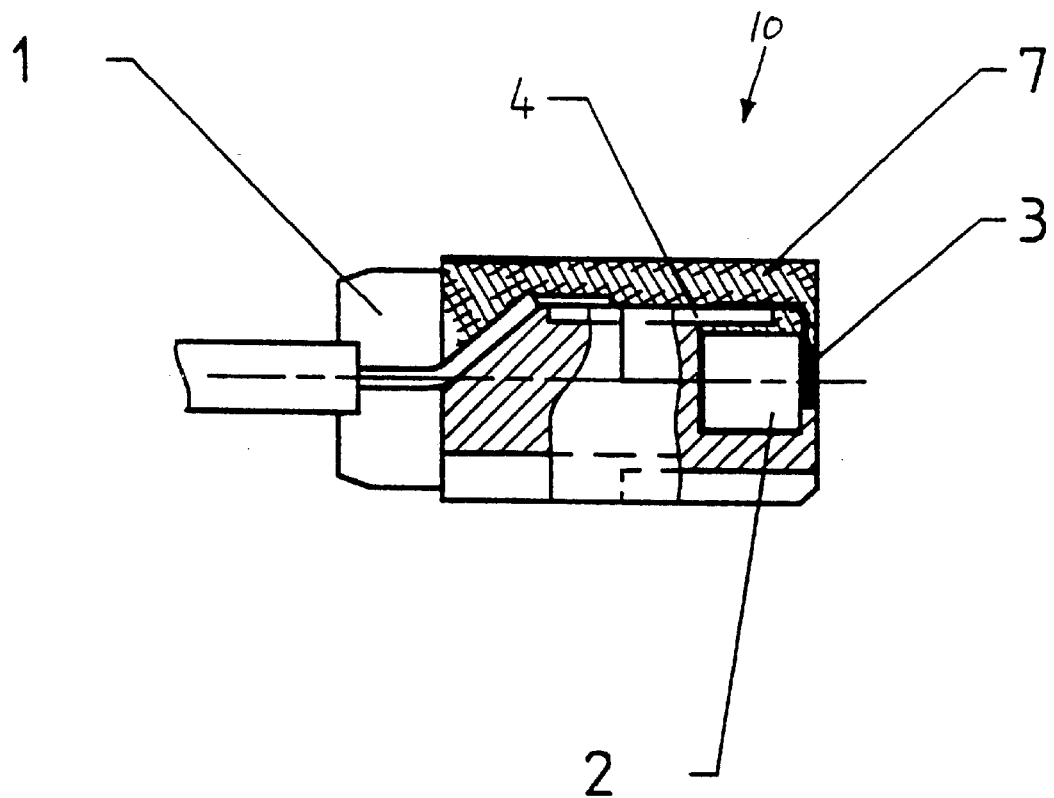
FIG. 1a shows a sectional view of a Hall sensor which was produced using the process in accordance with the present invention.
Figure 1B:
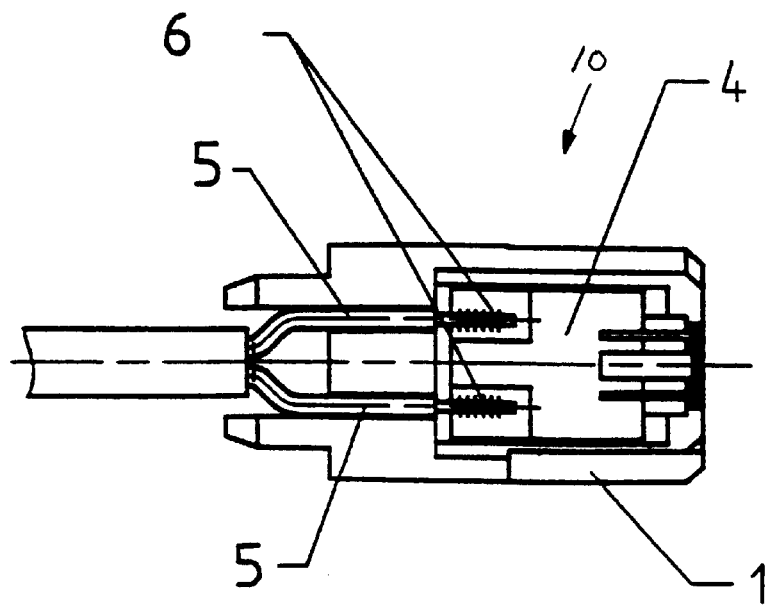
FIG. 1b shows a plan view of the Hall sensor of FIG. 1a but with the hot-melt adhesive removed.
Figure 2A:
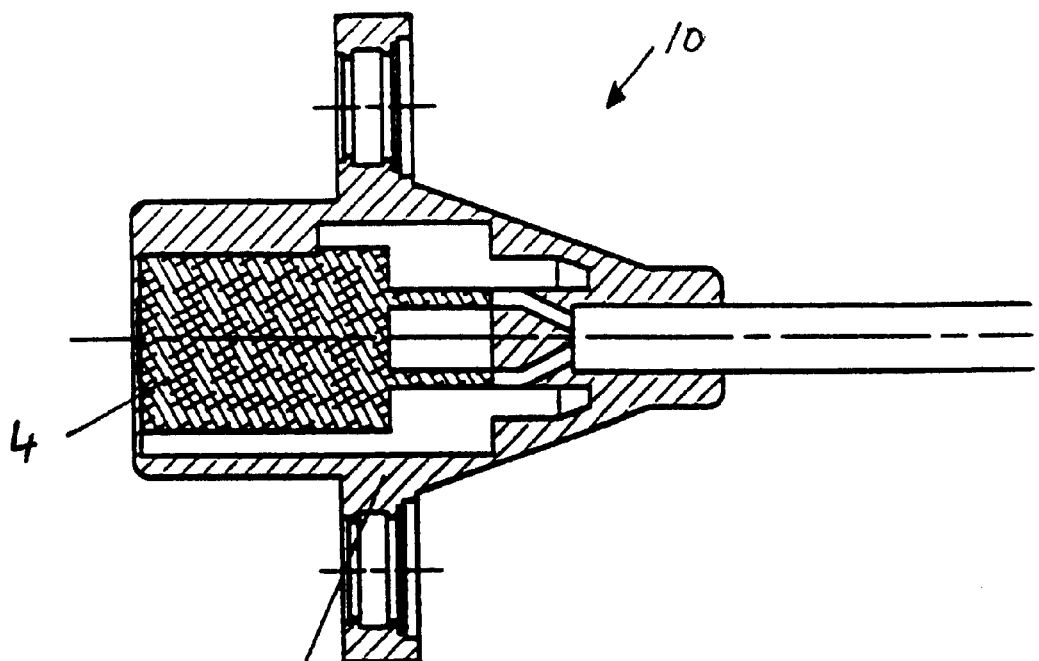
FIGS. 2a and 2b each show a sectional view of the Hall sensor shown in FIGS. 1a and 1b with a finish-extrusion coating which forms the housing.
Figure 2B:
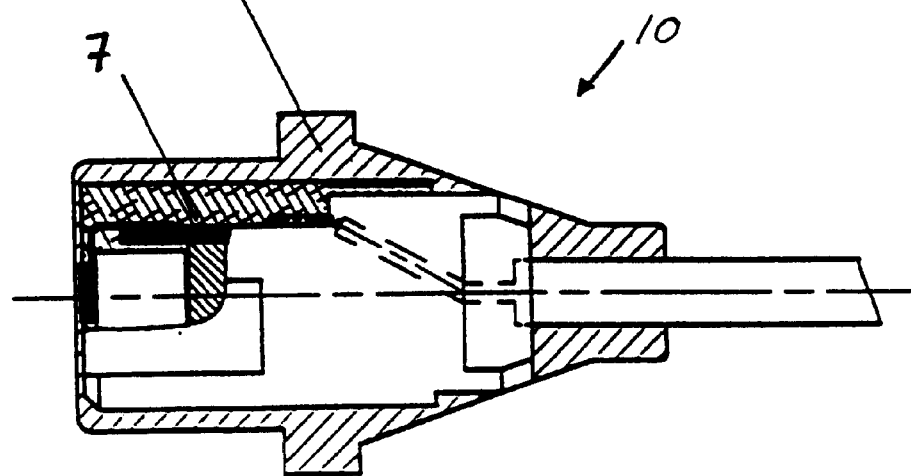

FIG. 1b shows a top view of the Hall sensor of FIG. 1a but with a hot-melt adhesive 7, which is described below, removed. FIGS. 2a and 2b show the Hall sensor 10 of FIGS. 1a and 1b with a finish-extrusion coating which forms a housing 8. The Hall sensor 10 includes a mount 1 which may be injected in a high pressure process, a magnet 2, a Hall IC 3 and a board 4 assembled with electronic components (not shown). In one embodiment of the present invention, this assembly, together with the soldered-on lead 5 with solder point 6, is extrusion coated in a mold (not shown) in a low pressure process with a hot-melt adhesive 7, which may be a copolymer polyamide, for example. In doing so, the hot-melt adhesive 7 with a temperature between 180 and 220° C. and a pressure between 2 and 10 bar, is injected into the mold cavity. The hot-melt adhesive 7 sets within a few seconds. Both the board 4 as well as all other components, specifically the magnet 2, the Hall IC 3 and the solder point 6, are embedded in the hot-melt adhesive 7 and fixed therein by this process.

After fixing the electronic components in the hot-melt adhesive 7, a finish-extrusion coating process forms the housing 8 as shown in FIG. 2a and 2b. The housing 8 together with any outside geometry is formed in the finish-extrusion coating process which is a high pressure process. Polyamide, duroplastic materials or other materials may be used in the finish-extrusion coating process.

More generally, in the process in accordance with the present invention, the arrangement of the sensitive electronic parts such as the sensor board 4 can take place not only by extrusion coating in the low pressure process, but also by embedding the parts in the hot-melt adhesive. Since the sensitive electronic parts have been fixed with the hot-melt adhesive in this way, finish-extrusion coating is carried out thereafter.

When identical or substantially similar materials with similar coefficients of thermal expansion are used for the mount 1 of the board 4, the fixing material, i.e., the hot-melt adhesive 7 and extrusion coating 8, different thermal expansions of these components can be avoided.

In addition, fixing of the electronic parts in a hot-melt adhesive 7 has the advantage in that the hot-melt adhesive 7 can be removed from the board without residue for diagnosis purposes or for recycling in case the Hall sensor 10 is damaged.

The process for producing an electronic component in accordance with the present invention is more efficient and cost effective than potting with PU or epoxy resins in which a later setting process (in a furnace or under a vacuum) is necessary. The arrangement of protective covers or caps or a housing for protection of the electronic parts becomes superfluous and unnecessary and can be eliminated.

Conversely, if reliable embedding and fixing of all parts are achieved by the process in accordance with the present invention, overly high pressure loads or temperature loads of the electronic parts are prevented in finish-extrusion coating which could lead to premature damage or destruction of the electronic parts. In addition, pulling off of parts as a result of different coefficients of thermal expansion of their materials is also prevented during temperature cycles.

Air inclusions need not be of concern. Embedding in hot-melt adhesive can be safely handled, and moreover, melting-on of the solder points during finish-extrusion coating at high pressures or temperatures is precluded.

While various embodiments in accordance with the present invention have been shown and described, it is understood that the invention is not limited thereto. These embodiments may be changed, modified and further applied by those skilled in the art. Therefore, this invention is not limited to the details shown and described previously but also includes all such changes and modifications which are encompassed by the appended claims.

I claim:

1. Process for producing an electronic component including temperature and pressure sensitive electronic parts located in a housing comprising the steps of:

embedding the temperature and pressure sensitive electronic parts in a hot-melt adhesive;

allowing the hot-melt adhesive to solidify; and providing a housing by a finish extrusion coating upon the solidified hot-melt adhesive surrounding the temperature and pressure sensitive electronic parts.

2. Process of claim 1, wherein said embedding step is performed by molding the hot-melt adhesive around the electronic parts.

3. Process of claim 1, wherein said embedding step is performed by extrusion-coating the electronic parts with the hot-melt adhesive.

4. Process of claim 1, wherein materials having substantially similar coefficients of thermal expansion are used for the hot-melt adhesive and the finish-extrusion coating that forms the housing.

5. Process as claimed in claim 4, wherein the materials are polyamides.

6. Process of claim 4, wherein said embedding step is performed by molding the hot-melt adhesive around the electronic parts.

7. Process of claim 4, wherein said embedding step is performed by extrusion-coating the electronic parts with the hot-melt adhesive.

8. Process of claim 1, wherein said electronic component is a Hall sensor.

9. Process of claim 8, wherein said embedding step is performed by molding the hot-melt adhesive around the electronic parts of the Hall sensor.

10. Process of claim 8, wherein said embedding step is performed by extrusion-coating the electronic parts of the Hall sensor with the hot-melt adhesive.

11. Process of claim 8, wherein materials having substantially similar coefficients of thermal expansion are used for the hot-melt adhesive and the finish-extrusion coating that forms the housing of the Hall sensor.

12. Process as claimed in claim 11, wherein the materials are polyamides.

13. Process of claim 12, wherein said embedding step is performed by molding the hot-melt adhesive around the electronic parts of the Hall sensor.

14. Process of claim 12, wherein said embedding step is performed by extrusion-coating the electronic parts of the Hall sensor with the hot-melt adhesive.

* * * * *